(12) United States Patent
Kugler (10) Patent No.: US 9,390,921 B2
(45) Date of Patent: Jul. 12, 2016

(54) ADHESION LAYER FOR SOLUTION-PROCESSED TRANSITION METAL OXIDES ON INERT METAL CONTACTS

(75) Inventor: Thomas Kugler, Milton (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 44 days.

(21) Appl. No.: 13/992,237

(22) PCT Filed: Dec. 1, 2011

(86) PCT No.: PCT/GB2011/001667
§ 371 (c)(1),
(2), (4) Date: Jun. 19, 2013

(87) PCT Pub. No.: WO2012/076835
PCT Pub. Date: Jun. 14, 2012

(65) Prior Publication Data
US 2013/0302998 A1 Nov. 14, 2013

(30) Foreign Application Priority Data

Dec. 6, 2010 (GB) .................................. 1020614.2

(51) Int. Cl.
*H01L 29/08* (2006.01)
*H01L 35/24* (2006.01)
(Continued)

(52) U.S. Cl.
CPC .......... *H01L 21/02658* (2013.01); *C23C 18/04* (2013.01); *C23C 18/1216* (2013.01); *C23C 18/1241* (2013.01)

(58) Field of Classification Search
USPC ............ 257/40, E51.018, E51.019, E51.024; 438/46; 252/518.1, 519.3
See application file for complete search history.

(56) References Cited

U.S. PATENT DOCUMENTS 4,539,507 A    9/1985   VanSlyke et al.
4,812,202 A *  3/1989   Bogenschutz et al. ........ 427/307
(Continued)

FOREIGN PATENT DOCUMENTS

CN    101447555 A    6/2009
CN    101800290 A    8/2010
(Continued)

OTHER PUBLICATIONS

Dabbous et al., "Study of Structural and Optical Properties of Sprayed $WO_3$ Thin Films Using Enhanced Characterization Techniques Along with the Boubaker Polynomials Expansion Scheme (BPES)," *Journal of Alloys and Compounds*, 487:286-292 (2009).
(Continued)

*Primary Examiner* — Telly Green
(74) *Attorney, Agent, or Firm* — Marshall, Gerstein & Borun LLP (57) ABSTRACT

An ammonium thio-transition metal complex is used as an adhesion promoter for immobilizing temperature-stable transition metal oxide layers on an inert metal surface. The ammonium thio-transition metal complex comprises a transition metal selected from molybdenum, tungsten and vanadium, and is preferably ammonium tetrathiomolybdate. A precursor of the transition metal oxide is deposited on the inert metal surface by a solution-based process. The precursor is a dispersion or a dissolution of the transition metal oxide, a transition metal oxide hydrate, an ammonium salt of an acidic transition metal oxide hydrate or phosphoric acid-transition metal oxide complex in water or a phosphoric acid-transition metal oxide complex dissolved in a polar organic solvent.

24 Claims, 2 Drawing Sheets

(51) Int. Cl.
H01L 51/00 (2006.01)
H01L 21/02 (2006.01)
C23C 18/04 (2006.01)
C23C 18/12 (2006.01)

(56) References Cited

U.S. PATENT DOCUMENTS

| | | | |
|---|---|---|---|
| 5,512,654 | A | 4/1996 | Holmes et al. |
| 6,593,450 | B2 | 7/2003 | Woo et al. |
| 8,927,099 | B2 * | 1/2015 | Ueno .................. C01B 31/34 252/301.36 |
| 2005/0112874 | A1 | 5/2005 | Skarp et al. |
| 2006/0186794 | A1 | 8/2006 | Pichler et al. |
| 2009/0015139 | A1 | 1/2009 | Uetani et al. |
| 2009/0103284 | A1 | 4/2009 | Suzuki et al. |
| 2009/0294765 | A1 | 12/2009 | Tanaka et al. |
| 2009/0315453 | A1 | 12/2009 | Kobayashi et al. |
| 2010/0025253 | A1 * | 2/2010 | Yoshioka et al. ........... 205/50 |
| 2010/0033086 | A1 | 2/2010 | Mikami et al. |
| 2011/0006294 | A1 | 1/2011 | Tanaka et al. |
| 2011/0127516 | A1 | 6/2011 | Nakatani et al. |
| 2011/0127517 | A1 | 6/2011 | Nakatani |
| 2011/0220853 | A1 | 9/2011 | Yoshimoto et al. |
| 2012/0012822 | A1 * | 1/2012 | Kakiuchi .............. C07F 7/0809 257/40 |
| 2012/0138916 | A1 * | 6/2012 | Ueno ................. H01L 51/0039 257/40 |
| 2012/0146010 | A1 * | 6/2012 | Ueno ..................... C01B 31/34 257/40 |

FOREIGN PATENT DOCUMENTS

| | | |
|---|---|---|
| DE | 10 2008 051 132 A1 | 1/2010 |
| EP | 0 712 171 A1 | 5/1996 |
| EP | 0 777 058 A1 | 6/1997 |
| EP | 0 850 960 A1 | 7/1998 |
| EP | 0 851 017 A1 | 7/1998 |
| EP | 1 009 045 A2 | 6/2000 |
| EP | 1 022 789 A2 | 7/2000 |
| EP | 1 030 539 A1 | 8/2000 |
| EP | 1 041 654 A1 | 10/2000 |
| FR | 2 736 061 A1 | 1/1997 |
| FR | 2 785 615 A1 | 5/2000 |
| JP | 03-062460 | 3/1991 |
| JP | 11061428 A * | 3/1999 |
| JP | 2007-150226 A | 6/2007 |
| WO | WO-90/13148 A1 | 11/1990 |
| WO | WO-95/06400 A1 | 3/1995 |
| WO | WO-99/48160 A1 | 9/1999 |
| WO | WO-99/65961 A1 | 12/1999 |
| WO | WO-00/02936 A1 | 1/2000 |
| WO | WO-00/55927 A1 | 9/2000 |
| WO | WO-02/092723 A1 | 11/2002 |
| WO | WO-2005/074329 A1 | 8/2005 |
| WO | WO-2006/096399 A2 | 9/2006 |
| WO | WO-2006/109083 A1 | 10/2006 |
| WO | WO-2006/123741 A1 | 11/2006 |
| WO | WO-2007/005618 A2 | 1/2007 |
| WO | WO-2008/016090 A1 | 2/2008 |
| WO | WO-2008/038747 A1 | 4/2008 |
| WO | WO-2008/111658 A1 | 9/2008 |
| WO | WO-2009/066061 A1 | 5/2009 |
| WO | WO-2009/097150 A2 | 8/2009 |
| WO | WO-2009/110642 A1 | 9/2009 |
| WO | WO-2010/013723 | 1/2010 |
| WO | WO-2010/013724 A1 | 2/2010 |
| WO | WO-2010/015822 A1 | 2/2010 |
| WO | WO-2010/058776 A1 | 5/2010 |
| WO | WO-2010/114583 A1 | 10/2010 |

OTHER PUBLICATIONS

Park et al., "High Mobility Solution Processed 6, 13-bis(triisopropyl-silylethynyl) Pentacene Organic Thin Film Transistors," *Appl. Phys. Lett.*, 91(6):063514 (2007).

Sirringhaus et al., "High-Resolution Inkjet Printing of All-Polymer Transistor Circuits," *Science*, 290:2123-2126 (2000).

Sivakumar et al., "Preparation and Characterization of Spray Deposited n-type $WO_3$ Thin Films for Electrochromic Devices," *Materials Research Bulletin*, 39:1479-1489 (2004).

Takahiko et al., "Organic Field-Effect Transistors with Reduced Contact Resistance," *Appl. Phys. Lett.*, 89:123508-1-123508—(2006).

International Preliminary Report on Patentability for Application No. PCT/GB2011/001667, dated Jun. 12, 2013.

International Search Report and Written Opinion for Application No. PCT/GB2011/001667, dated Mar. 27, 2012.

Search Report for Application No. GB1020614.2, dated Mar. 21, 2011.

Bacher et al., "Synthesis and Characterization of Photo-Cross-Linkable Hole-Conducting Polymers," *Macromolecules*, 38(5):1640-1647 (2005).

Bernius et al., "Progress with Light-Emitting Polymers," *Adv. Mat.*, 12(23):1737-1750 (2000).

Bharathan et al., "Polymer Electroluminescent Devices Processed by Inkjet Printing: I. Polymer Light-Emitting Logo," *Appl. Phys. Lett.*, 72:2660-2662 (1998).

Bolink et al., "Inverted Solution Processable OLEDs Using a Metal Oxide as an Electron Injection Contact," *Adv. Funct. Mater.*, 18:145-150 (2008).

Bubniene et al., "Synthesis of New Hole-Transporting Molecular Glass with Pendant Carbazolyl Moieties," *Synthetic Metals*, 158(16):670-675 (2008).

Chang et al., "Dual-Color Polymer Light-Emitting Pixels Processed by Hybrid Inkjet Printing," *Appl. Phys. Lett.*, 73:2561-2563 (1998).

Chen et al., "Effective Connecting Architecture for Tandem Organic Light-Emitting Devices," *Appl. Phys. Lett.*, 87(24):241121-241123 (2005).

Grice et al., "High Brightness and Efficiency Blue Light-Emitting Polymer Diodes," *Appl. Phys. Lett.*, 73:629-631 (1998).

Hebner et al., "Ink-Jet Printing of Doped Polymers for Organic Light Emitting Devices," *Appl. Phys. Lett.*, 72(5):519-521 (1998).

Huang et al., "Crosslinkable Hole-Transporting Materials for Solution Processed Polymer Light-Emitting Diodes," *J. Mat. Chem.*, 18:4495-4509 (2008).

Huang et al., "Solution-Processed Vanadium Oxide Interlayer for Improving the Performance of Polymer/ZnO Nanorod Hybrid Solar Cells," Proceedings of the 2009 34th IEEE Photovoltaic Specialists Conference, pp. 554-556 (2009).

Inagi et al., "Functional Polymers Based on Electron-Donating TTF and Derivatives," *J. Mat. Chem.*, 17:4122-4135 (2007).

Kageyama et al., "Hole-Transporting and Emitting Pendant Polymers for Organic Electroluminescent Devices," *Proc. of SPIE*, 6333 (2006).

Kanai et al., "Electronic Structure of Anode Interface with Molybdenum Oxide Buffer Layer," *Organic Electronics*, 11(2):188-194 (2010).

Kim et al., "Synthesis and Luminescence Properties of poly(p-phenylenevinylene) Derivatives Carrying Directly Attached Carbazole Pendants," *J. Mater. Chem.*, 11:3023-3030 (2001).

Liu, "Efficient Polymer Photovoltaic Cells Using Solution-Processed $MoO_3$ an Anode Buffer Layer," *Solar Energy Materials and Solar Cells*, 94(5):842-845 (2010).

Nawa et al., "Polymers Containing Pendant Oligothiophenes as a Novel Class of Electrochromic Materials," *J. Mat. Chem.*, 3(1):113-114 (1993).

Nawa et al., "Synthesis of a Novel Type of Electrochemically Doped Vinyl Polymer Containing Pendant Terthiophene and Its Electrical and Electrochromic Properties," *Macromolecules*, 28(3):723-729 (1995).

Niu et al., "Thermally Crosslinked Hole-Transporting Layers for Cascade Hole-Injection and Effective Electron-Blocking/Exciton-Confinement in Phosphorescent Polymer Light-Emitting Diodes," *Appl. Phys. Lett.*, 88:093505-093507 (2006).

(56) References Cited

OTHER PUBLICATIONS

Sekine et al., "ZnO Nano-Ridge Structure and its Application in Inverted Polymer Solar Cell," *Organic Electronics*, 10(8):1473-1477 (2009).

Service, "Self-Assembled LEDs Shine Brightly," *Science*, 279(5354):1135 (1998).

Shao et al., "Long-Lifetime Polymer Light-Emitting Electrochemical Cells Fabricated with Crosslinked Hole-Transport Layers," *Adv. Mater.*, 21:1972-1975 (2009).

Sugiyama et al., "Living Anionic Polymerization of Styrene Derivatives *para*-Substituted with π-Conjugated Oligo(fluorene) Moieties," *Macromolecules*, 42(12):4053-4062 (2009).

* cited by examiner

ADHESION LAYER FOR SOLUTION-PROCESSED TRANSITION METAL OXIDES ON INERT METAL CONTACTS

FIELD OF INVENTION

The present invention relates to use of an ammonium thio-transition metal complex as an adhesion promoter for immobilising temperature-stable transition metal oxide layers on an inert metal layer, a process for the formation of said temperature-stable transition metal oxide on an inert metal layer and in the provision of organic thin film transistors that have a temperature-stable transition metal oxide layer immobilised on a source and/or drain electrode thereof by use of an ammonium thio-transition metal complex as an adhesion promoter.

BACKGROUND OF THE INVENTION

Transistors can be divided into two main types: bipolar junction transistors and field-effect transistors. Both types share a common structure comprising three electrodes with a semiconductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semiconductive material which conducts positive charge carriers (holes) or negative charge carriers (electrons) respectively. The semiconductive material may be selected according to its ability to accept, conduct, and donate charge. The ability of the semiconductive material to accept, conduct, and donate holes or electrons can be enhanced by doping the material. The material used for the source and drain electrodes can also be selected according to its ability to accept and inject holes or electrons. For example, a p-type transistor device can be formed by selecting a semiconductive material which is efficient at accepting, conducting, and donating holes, and selecting a material for the source and drain electrodes which is efficient at injecting and accepting holes from the semiconductive material. Good energy-level matching of the Fermi-level in the electrodes with the HOMO (Highest Occupied Molecular Orbital) level of the semiconductive material can enhance hole injection and acceptance. In contrast, an n-type transistor device can be formed by selecting a semiconductive material which is efficient at accepting, conducting, and donating electrons, and selecting a material for the source and drain electrodes which is efficient at injecting electrons into, and accepting electrons from, the semiconductive material. Good energy-level matching of the Fermi-level in the electrodes with the LUMO (Lowest Unoccupied Molecular Orbital) level of the semiconductive material can enhance electron injection and acceptance.

Transistors can be formed by depositing the components in thin films to form thin film transistors. When an organic material is used as the semiconductive material in such a device, it is known as an organic thin film transistor.

Various arrangements for organic thin film transistors are known. One such device is an insulated gate field-effect transistor which comprises source and drain electrodes with a semiconductive material disposed therebetween in a channel region, a gate electrode disposed adjacent the semiconductive material and a layer of insulating material disposed between the gate electrode and the semiconductive material in the channel region.

Figure 1:
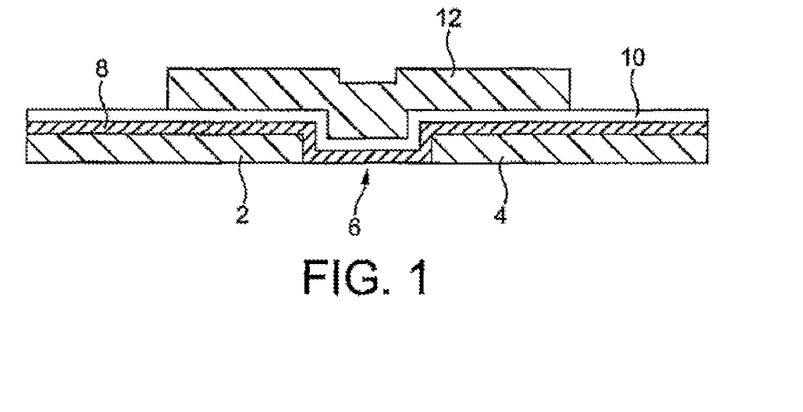
FIG. 1 shows a typical top gate thin film transistor.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

Figure 2:
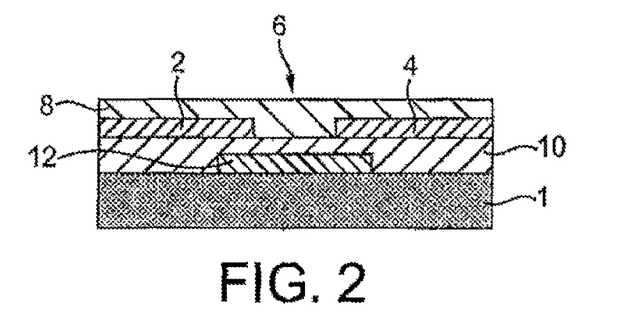
FIG. 2 shows a typical bottom gate thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (channel between the source and drain electrodes). Thus, in order to achieve high drain currents with low operational voltages, organic thin film transistors must have an organic semiconductor which has highly mobile charge carriers in the channel.

Charge carrier mobility is a measure of how easily a carrier moves in a particular material. This property of an organic semiconductor is, however, often compromised by the contact resistance of an organic thin film transistor device. A higher contact resistance results in a higher proportion of the applied voltage dropping across the interfaces between the source and drain electrodes and the organic semiconductor material in the transistor channel region and, as a result, a lower bias across the channel region is achieved. A high contact resistance thus has the effect of a much lower current level being extracted from the device due to the lower bias across the channel region, which comprises the charge carrier mobility of the organic semiconductor material.

Conventionally, contact resistance in organic transistors is reduced by applying surface treatment layers to the source and drain electrodes prior to depositing the semiconductor film or changing metal to a higher work function as necessary to inject charges to the HOMO level (for a p-type material).

Such treatment layers (typically self assembled monolayers applied from solution or vapour phase) are used to produce a dipole layer at the metal surface to effectively shift the work function of the source and drain contacts to align with the HOMO level in the semiconductor and therefore reduce the barrier for charge injection from metal to the semiconductor.

The range of electronic properties found amongst the transition metal oxides mean that they are particularly advantageous materials for controlling the work function and hence the charge-injection properties of an organic thin-film transistor (OTFT). WO 2007/005618 discloses the insertion of thin layers of transition-metal oxide such as $MoO_3$ between the organic semiconductor layer and the source and/or drain contacts in OTFTs. This prior art document, however, uses thermal evaporation to deposit the transition metal oxide. This has considerable disadvantages in terms of its potential for increasing up to a commercial scale process as it is both costly and inefficient.

Although transition metal oxides exhibit advantageous properties when deposited on the surfaces of source and drain electrodes of OTFTs, they do not adhere very well thereto.

Since source and drain electrodes must have the ability to accept and inject holes or electrons, they are usually fabricated from metallic conductors such as copper, silver or gold. Gold in particular is used for high-quality surface-to-surface contacts. These materials are, however, fairly unreactive. Pure gold is a chemically unreactive metal, whilst silver and copper surfaces react easily in air to form an unreactive metal oxide surface. Hence the source and drain electrode surfaces do not chemically react with the transition metal oxide layer deposited thereon. Significantly, these issues with adhesion can result in a non-uniform or even a discontinuous layer of transition metal oxide being deposited, making it extremely difficult to obtain repeatable results with the OTFTs. Thus whilst a transition metal oxide can improve contacts between the electrodes and active layers of an OTFT, its poor adhesion to the source and drain electrode surfaces when deposited thermally according to the prior art can limit the performance thereof.

There is thus a need to find an improved way of depositing transition metal oxide layers on inert metal layers. We have surprisingly found that it is possible to overcome the problems associated with metal oxide layers deposited by a thermal evaporation process according to the art by using an ammonium thio-transition metal complex as an adhesion promoter to immobilise transition metal oxides onto inert metal surfaces. The motivation for using such a complex is primarily to overcome the poor adhesion between the source and drain electrode surfaces and the transition metal oxide layer. This complex enables the formation of a continuous layer of transition metal oxide where the underlying substrate is made of an inert metal such as gold, onto which the transition metal oxide layer does not adhere well.

There are no examples of these complexes being used as adhesion promoters for organic thin-film transistors in the prior art. Rather the focus of the prior art is on improving the intrinsic electrical properties of the organic semiconductor layer within the OTFT and towards the development of device fabrication techniques ("High mobility solution processed 6,13-bis(triisopropyl-silylethynyl) pentacene organic thin film transistors"; S. K. Park et al., APPLIED PHYSICS LETTERS 91, 063514 (2007); Henning Sirringhaus, Takeo Kawase, Richard H. Friend, Tatsuya Shimoda, M. Inbasekaran, W. Wu, and E. P. Woo; "High-resolution inkjet printing of all-polymer transistor circuits", Science, 290, 2123-2126 (2000)). There has been no research published into the use of an adhesion promoter to immobilise a transition metal oxide layer onto the source and drain electrodes of an OTFT device.

Moreover adhesion of substrate layers in organic thin-film transistors is a crucial property to optimise because of the effect of poor adhesion on the performance of the device. There is therefore a need to find additional ways of improving the adhesion of transition metal oxide layers to inert metal surfaces in organic thin-film transistors. The present invention addresses this need.

SUMMARY OF THE INVENTION

We have surprisingly discovered that an ammonium thio-transition metal complex adhesion promoter enables the deposition of a continuous layer of transition metal oxide onto an inert metal surface such as gold. This adhesion promoter enables the deposition of a temperature-stable transition metal oxide layer onto the source and/or drain electrode surface within an organic thin-film transistor using solution deposition techniques to produce ohmic contacts between the organic semiconductor layer and the source and/or drain electrodes. This thus overcomes the disadvantages of thermal deposition of transition metal oxides described in the art. In particular the thermal deposition techniques of the prior art involve the use of shadow masks, which renders scaling-up of the process to large substrate sizes difficult in case of high resolution patterns. In contrast, the process of the present invention enables the use of solution-based processes that can easily be scaled up to large substrate sizes in both a cost-effective and efficient manner.

Thus, in a first aspect of the present invention (1) there is provided use of an ammonium thio-transition metal complex as an adhesion promoter for immobilising temperature-stable transition metal oxide layers on an inert metal surface.

Preferred uses according to the present invention include:
(2) use according to (1) wherein the ammonium thio-transition metal complex comprises a transition metal selected from molybdenum, tungsten and vanadium;
(3) use according to (1) or (2) wherein the ammonium thio-transition metal complex is a tetrathio-transition metal complex;
(4) use according to (3) wherein the ammonium tetrathio-transition metal complex is ammonium tetrathiomolybdate;
(5) use according to any one of (1) to (4) wherein the transition metal oxide is $MoO_3$, $WO_3$ or $V_2O_5$;
(6) use according to any one of (1) to (5) wherein a precursor of the transition metal oxide is deposited on the inert metal surface by a solution-based process;
(7) use according to (6) wherein the precursor is a dispersion or a dissolution of the transition metal oxide, transition metal oxide hydrate, ammonium salt of an acidic transition metal oxide hydrate or phosphoric acid-transition metal oxide complex in water or a phosphoric acid-transition metal oxide complex dissolved in a polar organic solvent;
(8) use according to (7) wherein the transition metal oxide to be deposited is $MoO_3$ and the precursor is a dispersion or a dissolution of molybdenum trioxide, molybdic acid, ammonium molybdate or phosphomolybdic acid in water, or phosphomolybdic acid dissolved in a polar organic solvent;
(9) use according to (7) wherein the transition metal oxide to be deposited is $WO_3$ and the precursor is a dispersion or a dissolution of tungsten trioxide, tungstic acid, ammonium tungstate or phosphotungstic acid in water, or phosphotungstic acid dissolved in a polar organic solvent;
(10) use according to (7) wherein the transition metal oxide to be deposited is $V_2O_5$ and the precursor is a dispersion or a dissolution of vanadium (V) oxide, ammonium metavanadate, vanadium(V) oxytriethoxide vanadium(V) oxytriethoxide, vanadium(V) oxytriisopropoxide or vanadium(V) oxytripropoxide dissolved in a polar organic solvent;

(11) use according to any one of (6) to (10) wherein the solution-based process consists of spin-coating, dip-coating or inkjet-printing;

(12) use according to any one of (1) to (11) wherein the inert metal is silver, gold, or copper;

(13) use according to (12) wherein the inert metal is gold; and (14) use according to any one of (1) to (13) wherein the transition metal oxide layer immobilised on the ammonium thio-transition metal complex is stable up to temperatures of at least 140° C.

We have also discovered that after deposition of an ammonium thio-transition metal complex onto an inert metal surface, solution-based processing of the transition metal oxide thereon produces a temperature-stable transition metal oxide layer. Solution-based processing of the transition metal oxide enables the use of simple and cost-effective solution deposition techniques such as spin-coating, dip-coating or ink-jet printing. In contrast to thermal evaporation, solution-based deposition techniques do not require vacuum, and can therefore easily be scaled-up to large substrate sizes and/or reel-to-reel fabrication processes.

Thus in a second aspect of the present invention there is provided:

(15) a process for forming a transition metal oxide on an inert metal surface comprising:
  (a) pre-treating the metal surface with an ammonium thio-transition metal complex;
  (b) depositing a solution comprising a transition metal oxide precursor onto the pre-treated surface; and
  (c) annealing the deposited solution to form a layer of transition metal oxide.

Preferred aspects of the second aspect of the invention include:

(16) a process according to (15) wherein step (a) comprises:
  (i) cleaning the metal surface to remove organic contaminants;
  (ii) depositing the ammonium thio-transition metal complex onto the metal surface; and
  (iii) annealing of the treated surface in air;

(17) a process according to (16) wherein the metal surface is cleaned by a UV-ozone treatment or an oxygen plasma treatment; and (18) a process according to any one of (15) to (17) wherein the solution-based deposition is conducted by spin-coating, dip-coating or inkjet printing.

One preferred use of the deposition of a temperature-stable transition metal oxide layer promoted using an ammonium thio-transition metal complex in accordance with the present invention is in the fabrication of an organic thin-film transistor device by use of an ammonium thio-transition metal complex on the source and/or drain electrodes thereof before deposition of the transition metal oxide layer. Significantly this results in the fabrication of ohmic contacts between the organic semiconductor layer and the source and/or drain electrodes of the device.

Thus, in a third aspect of the present invention there is provided:

(19) an organic thin-film transistor comprising source and drain electrodes, a gate electrode and an organic semiconductor layer, wherein the source and drain electrodes comprise an inert metal on which a temperature-stable transition metal oxide layer is immobilised by use of an ammonium thio-transition metal complex as an adhesion promoter.

Preferred aspects of the third aspect of the present invention include:

(20) an organic thin-film transistor according to (19) wherein the transition metal oxide is immobilised according to the process defined in any one of (15) to (18) above;

(21) an organic thin-film transistor according to (19) or (20) wherein the ammonium thio-transition metal complex is as defined in any one of (1) to (4) above; and (22) an organic thin-film transistor according to any one of (19) to (21) wherein the transition metal oxide is $MoO_3$, $WO_3$ or $V_2O_5$.

DETAILED DESCRIPTION OF THE INVENTION

As explained above, we have discovered that the use of an adhesion promoter is an excellent means of producing a temperature-stable transition metal oxide layer on an inert metal surface. By using an adhesion promoter such as an ammonium thio-transition metal complex the resulting transition metal oxide layer has a more stable work function when subjected to high temperatures compared to an inert metal surface without an adhesion promoter.

For example, the work function of an ammonium tetrathiomolybdate pre-treated gold surface with molybdic acid deposited thereon is substantially more stable at temperatures up to 140° C., compared to the work function of a UV-ozone cleaned gold surface with molybdic acid deposited thereon without the pre-treatment. The stability of the work function is particularly advantageous in an organic thin-film transistor device where the temperature-stable transition metal oxide layer immobilised using the ammonium thio-transition metal complex can be used to dope the interface between the source and/or drain electrodes and the organic semiconductor layer, thereby forming ohmic contacts at these interfaces. Consequently, the contact resistance at the interfaces between the source/drain contacts and the organic semiconductor in the transistor channel is minimised, reducing the barrier for charge injection from metal to semiconductor and resulting in a high performance organic thin-film transistor.

Preferred adhesion promoters are thio-transition metal complexes. These comprise complexes of a transition metal having at least one thio-transition metal bond. Particularly preferred are ammonium thio-transition metal complexes, for example ammonium tetrathiomolybdate.

The transition metal of the ammonium thio-transition metal complex is preferably selected from the group consisting of molybdenum, tungsten, and vanadium. Particularly preferred complexes include molybdenum (Mo) or tungsten (W).

The term "inert metal" is used herein to encompass any metal which does not allow for good adhesion of a transition metal oxide onto the metal surface. These metals do, however, allow good adhesion of the thio-transition metal complexes used in the present invention to the surface thereof. It is believed that this property of sulphur in the metal-thio bond in allowing adhesion on the inert metal surfaces is what allows the ammonium thio-transition metal complex to act as an adhesion promoter for the transition metal oxide layer.

Preferred inert metals for use in the invention are gold, silver or copper. A particularly preferred metal is gold.

The transition metal oxide used in accordance with the present invention is deposited by means of a solution-based process. More preferably a precursor of the transition metal oxide is deposited by means of a solution-based process. The solution-based process can consist of spin-coating, dip-coating, inkjet-printing or any technique known to the skilled man comprising the deposition of material from a solution onto a surface.

The term "precursor" as used herein refers to a dispersion or a dissolution of a transition metal in solution. A preferred precursor is a dispersion or a dissolution of a transition metal oxide, transition metal oxide hydrate, ammonium salt of an acidic transition metal oxide hydrate or phosphoric acid-transition metal oxide complex in water or a phosphoric acid-transition metal oxide complex dissolved in a polar organic solvent.

Examples of precursors which could be used in accordance with the current invention for deposition of molybdenum trioxide include a dispersion or dissolution of any of the following compounds in water: molybdenum trioxide, molybdic acid, ammonium molybdate or phosphomolybdic acid; or the dispersion of dissolution of a heteropolyacid in a polar organic solvent such as poly phosphomolybdic acid.

For the deposition of tungsten trioxide the preferred precursor is a dispersion or a dissolution of any of the following compounds in water: tungsten trioxide, tungstic acid, ammonium tungstate or phosphotungstic acid; or the dispersion or dissolution of a heteropolyacid in a polar organic solvent such as phosphotungstic acid.

For the deposition of vanadium pentoxide the preferred precursor is a dispersion or a dissolution of any of the following compounds in water: vanadium (V) oxide, ammonium metavanadate, vanadium (V) oxytriethoxide, vanadium (V) oxytriisopropoxide or vanadium (V) oxytripropoxide; or a dispersion or a dissolution of a heteropolyacid in a polar organic solvent such as vanadium (V) oxytriethoxide, vanadium (V) oxytriisopropoxide or vanadium (V) oxytripropoxide. Possible organic solvents include pyridine, acetonitrile, tetrahydrofurane or any other polar organic solvent known to the skilled man.

The deposited transition metal oxide in accordance with the present invention encompasses any transition metal oxide in which the metal cations assume a high oxidation state and are capable of p-doping the organic semiconductor material in the transistor channel. Preferably the transition metal oxide is an oxide of molybdenum, tungsten or vanadium, more preferably an oxide of molybdenum. Preferred transition metal oxides are selected from the group consisting of $MoO_3$, $WO_3$ or $V_2O_5$, most preferably $MoO_3$.

The resulting transition metal oxide layer is temperature-stable. Stability is preferably measured by the surface work function at temperatures up to at least 140° C., preferably at temperatures up to 170° C., and more preferably at temperatures up to 200° C.

The process of the invention involves the formation of an insulating transition metal oxide on an inert metal surface. This process typically involves pre-treatment of the surface with an adhesion promoter, deposition of a transition metal oxide precursor and annealing to form a transition metal oxide layer. The adhesion promoter, precursor, the deposition process of the precursor and the transition metal oxide are as hereinbefore defined. The annealing process to form a transition metal oxide layer is preferably carried out at a temperature between 120 to 250° C.

Preferably pre-treatment of the inert metal surface comprises:
  (i) cleaning the metal surface;
  (ii) depositing an ammonium thio-transition metal complex onto the metal surface; and
  (iii) annealing of the treated surface in air.

The cleaning step of the process according to the current invention consists of any treatment which removes organic contaminants. Preferably the inert metal surface is cleaned by a UV-ozone treatment or an oxygen plasma treatment. Particularly preferred is a UV-ozone treatment. By such an oxidative cleaning process, the metal surface is rendered hydrophilic and its surface work function increased. Using a gold surface treated with UV-ozone as an example, the surface work function increases to approximately 5.6 eV and the gold surface is rendered hydrophilic.

Deposition of an ammonium thio-transition metal complex onto the cleaned metal surface is preferably via a solution-based process. The solution used is preferably a solution of the ammonium thio-transition metal complex in water, the concentration depending on the solubility of the ammonium thio-transition metal complex in water (e.g. a 0.5% (w/w) solution), and after deposition the pre-treated surface is dried by any means known to the skilled man. It is found that the pre-treated surface typically has a lower work function compared to the cleaned metal surface described above. Using ammonium tetrathiomolybdate in water as an example, when the substrate is immersed in a 0.5% (w/w) solution of ammonium tetrathiomolybdate in water and then blow-dried with a nitrogen gun, this pre-treatment decreases the surface work function to approximately 4.6 eV.

Drying or annealing of the treated surface in air is preferably carried out at a temperature between 120 to 250° C. Particularly preferred is drying of the treated surface at a temperature towards the lower end of this range (e.g. 120° C. to 150° C.) for a period of time (e.g. 5 to 20 minutes), followed by annealing of the treated surface at a temperature towards the higher end of this range (e.g. 150° C. to 250° C.) for a period of time (e.g. 5 to 30 minutes). Annealing of the treated surface in air is generally found to result in an increase of the surface work function. Using an ammonium tetrathiomolybdate pre-treated gold substrate as an example, the surface is first dried at 125° C. for 5 minutes and then annealed at 175° C. for 10 minutes. The surface work function correspondingly increases from 4.6 eV to 4.95 eV and then 5.1 eV.

The deposition of the precursor of a transition metal oxide is preferably by a solution-based process in which the ammonium thio-transition metal complex pre-treated surface is immersed in a dispersion or a dissolution of the transition metal oxide, transition metal oxide hydrate, ammonium salt of an acidic transition metal oxide hydrate or phosphoric acid-transition metal oxide complex in water or a phosphoric acid-transition metal oxide complex dissolved in a polar organic solvent, and then dried using any means known to the skilled man. The deposition of the precursor typically increases the surface work function. Using an ammonium tetrathiomolybdate pre-treated gold substrate and the deposition of molybdenum (IV) oxide thereon as an example, the substrate was immersed in a 2% (w/w) solution of molybdic acid in water and then blown-dry with a nitrogen gun. The surface work function increased to 5.43 eV from 4.8 eV.

Alternatively the molybdic acid solution could have been applied by spin-coating or using an additive process such as inkjet printing. If inkjet printing is used, the spatial resolution of this process is preferably increased by using surface energy patterns to prevent the aqueous molybdic acid solution from spreading from the hydrophilic inert metal patterns onto the substrate.

After application of the precursor of a transition metal oxide onto the ammonium thio-transition metal complex pre-treated substrate, the precursor is converted to the transition metal oxide by thermal annealing. Annealing is preferably carried out between 120 to 200° C. Preferably the surface is dried at a temperature towards the lower end of this range for a period of time and then annealed at a temperature towards the higher end of this range for a period of time. Upon annealing we have found that the surface work function remains stable. Using molybdic acid on an ammonium tetrathiomolybdate pre-treated gold surface as an example, the surface was dried at 120° C. for 5 minutes and then annealed at 140° C. for 5 minutes. The surface work function remained stable up to 140° C. at a value of approximately 5.4 eV.

The organic thin film transistors according to the invention may be any organic thin film transistor that comprises an organic semiconductor layer. The transistors can be p-type or n-type. Suitable transistor configurations include top-gate transistors and bottom-gate transistors. One preferred example of the uses and processes according to the invention is in the preparation of an organic thin film transistor comprising source and drain electrodes, a gate electrode and an organic semiconductor layer, wherein the source and drain electrodes comprise an inert metal on which a temperature-stable transition metal oxide layer is immobilised by use of an ammonium thio-transition metal complex as an adhesion promoter. Both the transition metal oxide layer and the ammonium thio-transition metal complex are as hereinbefore defined.

By using an ammonium thio-transition metal complex as hereinbefore defined a temperature-stable transition metal oxide can be deposited onto the inert metal surface of the source and drain contacts of the OTFT by a process described above. The present invention therefore makes it possible to use a transition metal oxide layer to dope the interface between the source and drain contacts and the organic semiconductor layer, thereby creating an Ohmic contact in a stable, simple and cost effective manner. Further, the solution-based process for deposition of said layer in accordance with the process of the present invention is scalable up to large substrate sizes, making it far more practical for industrial application than prior art processes.

The present invention may be further understood by consideration of the following examples with reference to the following drawings.

MEASUREMENT OF ENERGY VALUES WITH THE AC-2 SPECTROMETER

Figure 3:
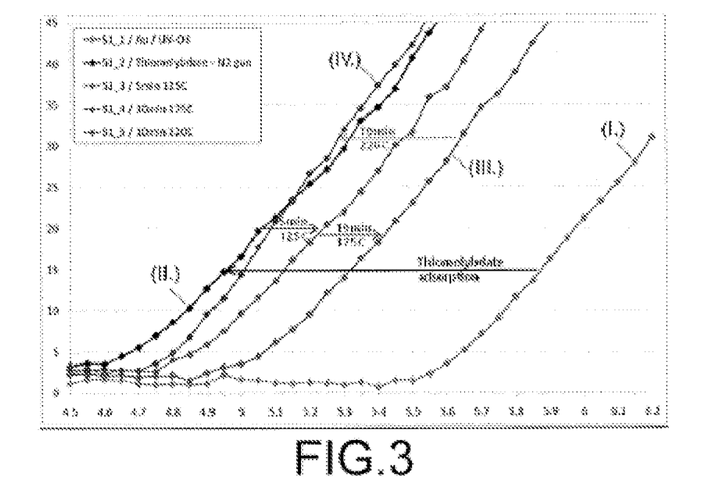
FIG. 3 is a photoelectron spectrum recorded with an AC-2 spectrometer of photoelectron yield against photon energy measured for gold source and drain contacts at various stages during the deposition of ammonium tetrathiomolybdate thereon according to the present invention.
Figure 4:
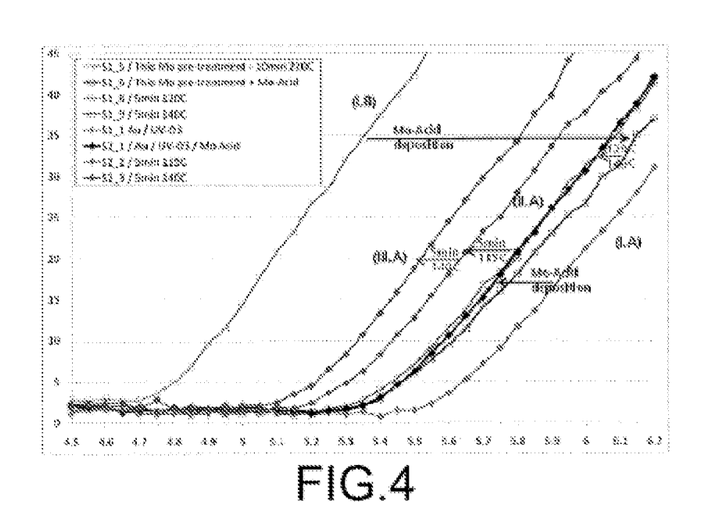
FIG. 4 is a photoelectron spectrum recorded with an AC-2 spectrometer of photoelectron yield against photon energy measured at various stages for gold source and drain contacts pre-treated with an ammonium thiomolydate adhesion layer during deposition of Mo-Acid thereon and annealing thereof to give a layer of molybdenum oxide according to the present invention.

The energy level values plotted in FIGS. 3 and 4 were measured using the AC-2 photoelectron spectrometer available from RK Instruments Inc. The measurements were performed in air by probing a sample that was typically several square millimeters in area, and included the following steps:
UV photons emitted from a deuterium lamp were monochromatised through the grating monochromator;
the monochromatised UV photons were focused on a sample surface in the air;
the energy of UV photon was increased from 3.4 eV to 6.2 eV, step by step;
when the energy of the UV photon was higher than the threshold energy of photoemission of the sample material (i.e. the Ionisation Potential), the photoelectrons were emitted from the sample surface;
photoelectrons emitted from the sample were then detected and counted in the air by the open counter; and
the photoemission threshold (Ionisation Potential) was determined from the energy of an intersecting point between a background line and the extended line of the square root of the photoelectric quantum yield.

EXAMPLES

The following examples focus on the process of forming a transition metal oxide on an inert metal surface using an ammonium tetrathiomolybdate adhesion promoter to obtain a temperature-stable organic thin-film transistor (OTFT) device as an example of the present invention.

Example 1

(A) Pre-Treatment of Gold Source and Drain Contacts by Application of Ammonium Tetrathiomolybdate The objective of these experiments was to pre-treat the inert surface of gold source and drain contacts by application of ammonium tetrathiomolybdate.
I. UV-Ozone Cleaning
An OTFT substrate comprising gold source and drain contacts on a glass substrate was treated with UV-ozone. In addition to partially removing organic contaminants, the UV-ozone treatment was found to increase the work function of the gold contacts to approximately 5.6 eV and rendered the gold surface hydrophilic. This change in work function of the surface is shown in FIG. 3 by the label (I).
II. Adsorption of Ammonium Tetrathiomolybdate
The UV-ozone treated OTFT substrate was then immersed in a 0.5% (w/w) solution of ammonium tetrathiomolybdate in water and blow-dried with a nitrogen gun.
The adsorption of ammonium tetrathiomolybdate resulted in a decrease of the surface work function of the gold contacts to 4.6 eV. This is shown in FIG. 3 by the label (II).
III. Annealing in Air
The pre-treated gold contacts were then dried in air at 125° C. for 5 minutes and then annealed in air at 175° C. for 10 minutes. This annealing of the surface resulted in a gradual increase of the surface work function first to 4.95 eV and then to 5.1 eV. This is shown in FIG. 3 by the label (III).
IV. Thermal Decomposition in Air
Finally the pre-treated gold contacts were annealed in air at 220° C. for 10 minutes. This resulted in a strong decrease of the surface work function to 4.8 eV. This is shown in FIG. 3 by the label (IV).

(B) Application of Molybdic Acid

The ammonium tetrathiomolybdate pre-treated OTFT substrate was then immersed in a 2% (w/w) solution of molybdic acid in water, and blown-dry with a nitrogen gun.
The molybdic acid solution could also have been applied by spin-coating or by means of an additive process such as inkjet printing. In order to increase the spatial resolution of inkjet printing, surface energy patterns could be used to prevent the aqueous molybdic acid solution from spreading from the hydrophilic gold patterns onto the substrate. Such surface energy patterns could be pre-defined using photolithography.

(C) Conversion of Deposited Molybdic Acid to Molybdenum (IV) Oxide

After application of the molybdic acid solution onto the pre-treated gold contacts, the molybdic acid was converted to molybdenum (IV) oxide by thermal annealing. First the surface was dried in air for 5 minutes at 120° C. and then annealed in air for 5 minutes at 140° C.

Without a tetrathiomolybdate adhesion layer, annealing of molybdic acid on gold resulted in a fast degradation of the surface work function. This is demonstrated by the following example.

Example 2

(A) Without an Ammonium Tetrathiomolybdate Adhesion Layer (I.A) UV-Ozone Treatment
An OTFT substrate comprising gold source and drain contacts on a glass substrate was treated with UV-ozone. This pre-treatment increased the work function of the contacts surfaces to 5.6 eV. This is shown in FIG. 4 by the label (I.A).
(II.A) Molybdic Acid Deposition
The UV-ozone pre-treated gold surface was then immersed in a 2% (w/w) solution of molybdic acid in water, and blown-dry with a nitrogen gun. The deposition of molybdic acid resulted in a decrease of the surface work function to 5.43 eV. This is shown in FIG. 4 by the label (II.A).
(III.A) Annealing in Air
Finally the molybdic acid was converted to $MoO_3$ by annealing in air; first by drying at 115° C. for 5 minutes and then annealing at 140° C. for a further 5 minutes. This resulted in a further gradual decrease of the surface work function first to 5.3 eV and then to 5.2 eV. This is shown in FIG. 4 by the label (III.A).

(B) With an Ammonium Tetrathiomolybdate Adhesion Layer (I.B) UV-Ozone Treatment
An OTFT substrate comprising gold source and drain contacts on a glass substrate was pre-treated with UV-ozone, immersed in a 0.5% (w/w) solution of ammonium tetrathiomolybdate in water, blow dried with a nitrogen gun and then annealed in air for 10 minutes at 220° C. The resulting ammonium tetrathiomolybdate pre-treated & annealed substrate had an initial work function of 4.8 eV. This is shown in FIG. 4 by the label (I.B).
(II.B) Molybdic Acid Deposition
The ammonium tetrathiomolybdate pre-treated gold contacts were then immersed in a 2% (w/w) solution of molybdic acid in water, and blown-dry with a nitrogen gun. The deposition of molybdic acid resulted in an increase of the surface work function to 5.43 eV. This is shown in FIG. 4 by the label (II.B).
(III.B) Annealing in Air
Finally the molybdic acid was converted to $MoO_3$ by annealing in air; first by drying at 120° C. for 5 minutes and then annealing at 140° C. for a further 5 minutes. Upon annealing the surface work function remained fairly stable with a value of 5.43 eV after 5 minutes at 120° C. and 5.4 eV after 5 minutes at 140° C. This is shown in FIG. 4.

This comparison shows that without an ammonium tetrathiomolybdate adhesion layer, annealing of molybdic acid on gold results in a fast degradation of the surface work function. In contrast, when an ammonium tetrathiomolybdate adhesion layer is used the surface work function during annealing of the molybdic acid remains fairly stable. As a result the present invention has a useful application in the fabrication of temperature-stable ohmic contacts between the organic semiconductor layer and the source and/or drain electrodes within an organic thin-film transistor device.

After thermal conversion of the molybdic acid to molybdenum (IV) oxide ($MoO_3$), the organic semiconductive layer and dielectric layer of the OTFT were deposited thereon, followed by thermal evaporation of the gate electrode. These further steps to produce an organic thin-film transistor in accordance with the present invention can be carried out by any technique known to the skilled man.

The invention claimed is:
1. A process for preparing an organic thin-film transistor comprising source and drain electrodes, a gate electrode and an organic semiconductor layer, the process comprising:
  pre-treating an inert metal surface of the source and drain electrodes with an ammonium thio-transition metal complex to form a pre-treated surface comprising an adhesion promoter layer comprising the ammonium thio-transition metal complex; and
  forming, on the pre-treated surface, a layer of a temperature-stable transition metal oxide, thereby immobilizing the temperature-stable transition metal oxide on the adhesion promoter layer,
  wherein the adhesion promoter layer is in contact with the inert metal surface and the temperature-stable transition metal oxide layer is in contact with the adhesion promoter layer.
2. The process according to claim 1 wherein the ammonium thio-transition metal complex comprises a transition metal selected from molybdenum, tungsten and vanadium.
3. The process according to claim 1 wherein the ammonium thio-transition metal complex is a tetrathio-transition metal complex.
4. The process according to claim 3 wherein the ammonium tetrathio-transition metal complex is ammonium tetrathiomolybdate.
5. The process according to claim 1 wherein the temperature-stable transition metal oxide is $MoO_3$, $WO_3$ or $V_2O_5$.
6. The process according to claim 1 wherein a precursor of the temperature-stable transition metal oxide is deposited on the inert metal surface by a solution-based process.
7. The process according to claim 6 wherein the precursor is a dispersion or a dissolution of the temperature-stable transition metal oxide, a transition metal oxide hydrate, an ammonium salt of an acidic transition metal oxide hydrate or phosphoric acid-transition metal oxide complex in water or a phosphoric acid-transition metal oxide complex dissolved in a polar organic solvent.
8. The process according to claim 7 wherein the temperature-stable transition metal oxide is $MoO_3$ and the precursor is a dispersion or a dissolution of molybdenum trioxide, molybdic acid, ammonium molybdate or phosphomolybdic acid in water, or phosphomolybdic acid dissolved in a polar organic solvent.
9. The process according to claim 7 wherein the temperature-stable transition metal oxide is $WO_3$ and the precursor is a dispersion or a dissolution of tungsten trioxide, tungstic acid, ammonium tungstate or phosphotungstic acid in water, or phosphotungstic acid dissolved in a polar organic solvent.

10. The process according to claim 7 wherein the temperature-stable transition metal oxide is $V_2O_5$ and the precursor is a dispersion or a dissolution of vanadium (V) oxide, ammonium metavanadate, vanadium(V) oxytriethoxide vanadium (V) oxytriethoxide, vanadium(V) oxytriisopropoxide or vanadium(V) oxytripropoxide dissolved in a polar organic solvent.

11. The process according to claim 6 wherein the solution-based process is selected from the group consisting of spin-coating, dip-coating and inkjet-printing.

12. The process according to claim 1 wherein the inert metal is silver, gold, or copper.

13. The process according to claim 12 wherein the inert metal is gold.

14. The process according to claim 1 wherein the temperature-stable transition metal oxide layer immobilized on the inert metal surface is stable up to temperatures of at least 140° C.

15. A process for preparing an organic thin-film transistor comprising source and drain electrodes, a gate electrode and an organic semiconductor layer, the process comprising:
(a) pre-treating an inert metal surface of the source and drain electrodes with an ammonium thio-transition metal complex to form an adhesion promoter layer comprising the ammonium thio-transition metal complex;
(b) depositing a solution comprising a temperature-stable transition metal oxide precursor onto the adhesion promoter layer; and
(c) annealing the deposited solution to form a layer of temperature-stable transition metal oxide, wherein the adhesion promoter layer is in contact with the inert metal surface and the temperature-stable transition metal oxide layer is in contact with the adhesion promoter layer.

16. A process according to claim 15 wherein step (a) comprises:
(i) cleaning the inert metal surface to remove organic contaminants;
(ii) depositing the ammonium thio-transition metal complex onto the inert metal surface; and
(iii) annealing of the treated surface in air.

17. A process according to claim 16 further comprising cleaning the metal surface by a UV-ozone treatment or an oxygen plasma treatment.

18. A process according to claim 15 wherein the step of depositing the solution comprising the temperature-stable transition metal oxide precursor is conducted by spin-coating, dip-coating or inkjet printing.

19. An organic thin-film transistor comprising source and drain electrodes, a gate electrode and an organic semiconductor layer, wherein the source and drain electrodes comprise an inert metal surface on which a temperature-stable transition metal oxide layer is immobilized by an adhesion promoter layer comprising an ammonium thio-transition metal complex, wherein the adhesion promoter layer is in contact with the inert metal surface and the temperature-stable transition metal oxide layer is in contact with the adhesion promoter layer.

20. An organic thin-film transistor according to claim 19 wherein the temperature-stable transition metal oxide is immobilized by:
(a) pre-treating the inert metal surface of the source and drain electrodes with the ammonium thio-transition metal complex to form the adhesion promoter layer comprising the ammonium thio-transition metal complex;
(b) depositing a solution comprising the temperature-stable transition metal oxide precursor onto the adhesion promoter layer; and
(c) annealing the deposited solution to form a layer of temperature-stable transition metal oxide.

21. An organic thin-film transistor according to claim 19 wherein the ammonium thio-transition metal complex comprises a transition metal selected from molybdenum, tungsten and vanadium.

22. An organic thin-film transistor according to claim 19 wherein the temperature-stable transition metal oxide is $MoO_3$, $WO_3$ or $V_2O_5$.

23. An organic thin-film transistor according to claim 19 wherein the ammonium thio-transition metal complex is a tetrathio-transition metal complex.

24. An organic thin-film transistor according to claim 19 wherein the ammonium tetrathio-transition metal complex is ammonium tetrathiomolybdate.

* * * * *